(12) United States Patent
Hwang et al.

(10) Patent No.: US 8,247,698 B2
(45) Date of Patent: Aug. 21, 2012

(54) ELECTRONIC DEVICE AND LATCHING MECHANISM THEREOF

(75) Inventors: Ching-Bai Hwang, Taipei Hsien (TW); Hung-Nien Chiu, Taipei Hsien (TW); Shu-Cheng Yang, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 164 days.

(21) Appl. No.: 12/775,499

(22) Filed: May 7, 2010

(65) Prior Publication Data

US 2011/0247861 A1 Oct. 13, 2011

(30) Foreign Application Priority Data

Apr. 8, 2010 (TW) ............................. 99110826 A

(51) Int. Cl.
*H05K 1/00* (2006.01)

(52) U.S. Cl. ...... 174/252; 174/15.1; 174/15.2; 361/695; 361/381; 361/698

(58) Field of Classification Search ................ 174/252, 174/15.1, 15.2; 361/695, 385, 698, 700
See application file for complete search history.

(56) References Cited

U.S. PATENT DOCUMENTS

| 7,369,408 | B2 * | 5/2008 | Chang | 361/697 |
| 7,688,587 | B2 * | 3/2010 | Ishikawa | 361/695 |
| 7,830,665 | B2 * | 11/2010 | Lin | 361/700 |

* cited by examiner

*Primary Examiner* — Yuriy Semenenko
*Assistant Examiner* — Andargie M Aychillhum
(74) *Attorney, Agent, or Firm* — Altis Law Group, Inc.

(57) ABSTRACT

An exemplary electronic device includes a circuit board defining apertures therein, an electronic component arranged on the circuit board and surrounded by the apertures, a heat spreader arranged on the electronic component, and a latching mechanism fixing the heat spreader to the electronic component. The latching mechanism includes latching arms extending outwards from the heat spreader and elastic poles. Each latching arm defines a latching hole aligned with one of the apertures of the circuit board. The poles respectively extend through the apertures and the latching holes in turn. Each pole includes a main body engaged in the corresponding latching hole and a head resiliently abutting against the latching arm.

15 Claims, 3 Drawing Sheets

ELECTRONIC DEVICE AND LATCHING MECHANISM THEREOF

BACKGROUND

1. Technical Field

The present disclosure relates generally to electronic devices with thermal modules, and more particularly to a latching mechanism which can fix a thermal module to the electronic device easily.

2. Description of Related Art

With the continuing development of electronics technology, electronic components of electronic devices, such as central processing units (CPUs), memory modules, and video graphics array (VGA) chips, generate much heat in operation. The heat needs to be dissipated efficiently to ensure the continued proper functioning of the electronic device. Generally, a thermal module is provided to dissipate the heat of the electronic component. However, the thermal module is usually secured to a circuit board on which the electronic component is arranged by a plurality of screws. Operating threaded elements involving the electronic devices is inconvenient and time-consuming.

What is needed, therefore, is an electronic device incorporating a latching mechanism to overcome the above-described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure provides examples and is not intended to be limiting. It should be noted that references to "an" or "one" embodiment in this disclosure are not necessarily references to the same embodiment, and such references can mean "at least one" embodiment.

Figure 1:
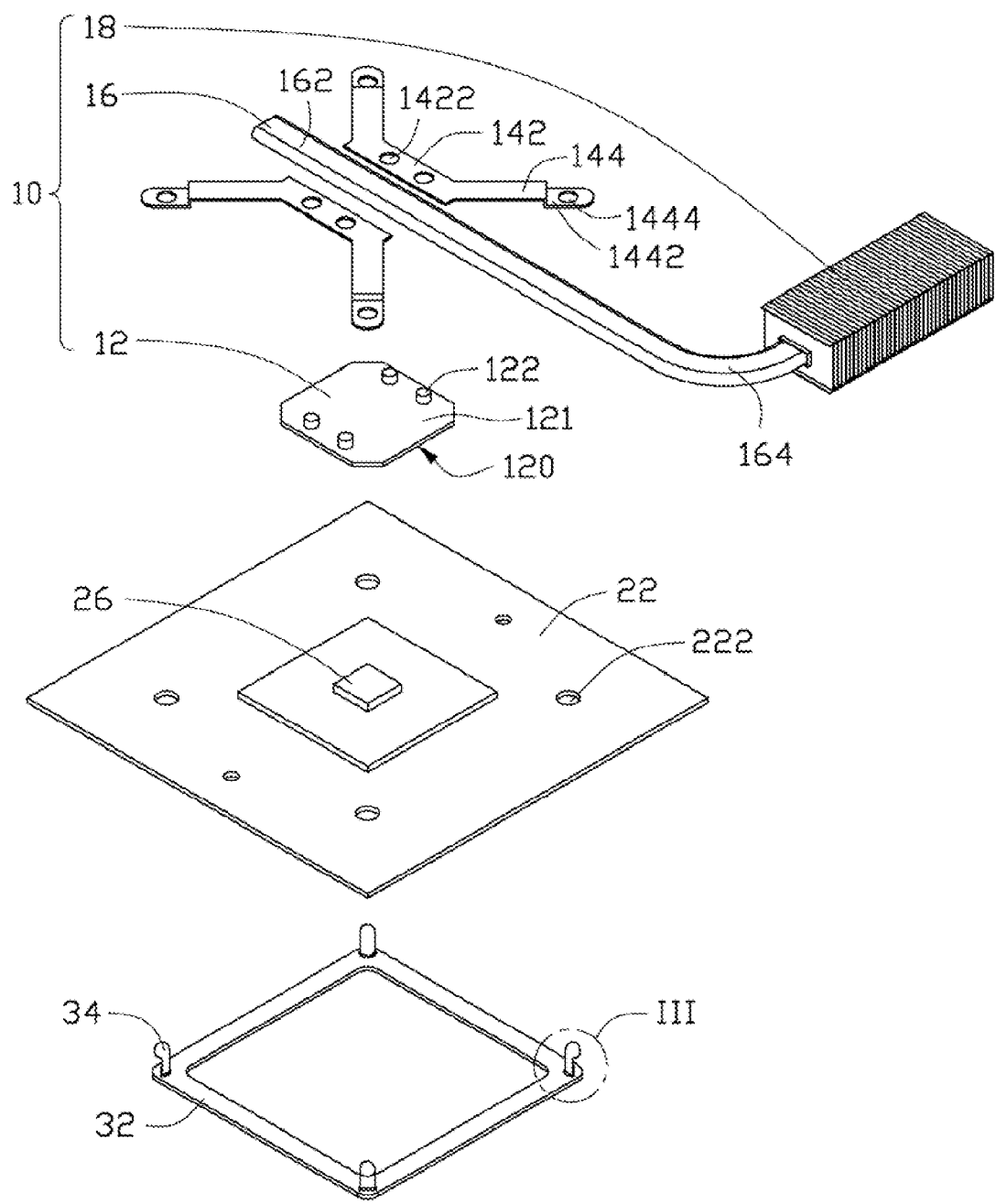
FIG. 1 is an isometric, exploded view of an electronic device, according to an exemplary embodiment.
Figure 2:
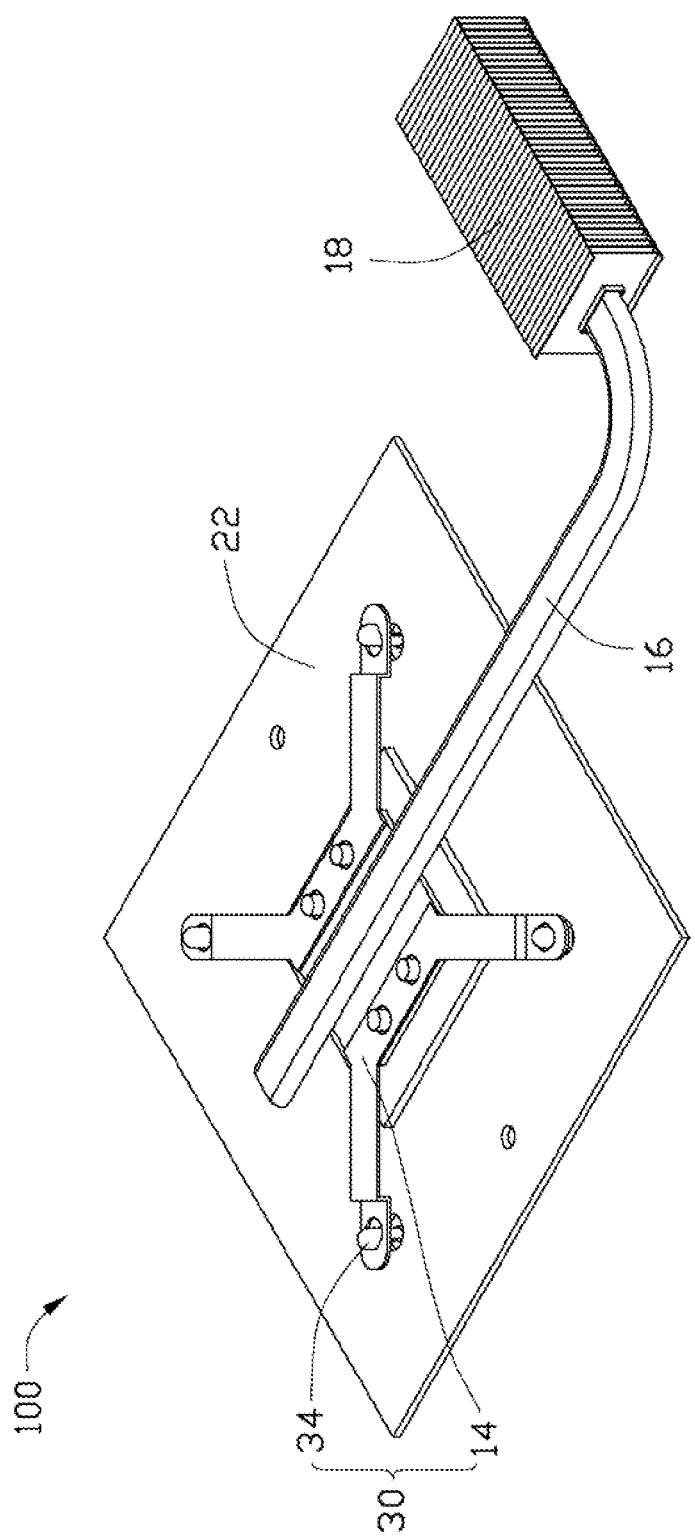
FIG. 2 is an assembled view of FIG. 1.

Referring to FIGS. 1 and 2, an electronic device 100 according to an exemplary embodiment is shown. The electronic device 100 includes a circuit board 22, an electronic component 26 arranged on the circuit board 22, a thermal module 10 disposed on the electronic component 26, and a latching mechanism 30 for fixing the thermal module 10 to the electronic component 26.

The thermal module 10 includes a heat spreader 12, a heat pipe 16, and a heat sink 18.

The heat spreader 12 is made of metal or metal alloy which has a high heat conductivity coefficient, such as copper or copper-alloy. The heat spreader 12 is substantially rectangular and flat. A size of the heat spreader 12 is larger than that of the electronic component 26. The heat spreader 12 includes a planar bottom face 120 configured for contacting the electronic component 26, and a planar top face 121. A plurality of posts 122 extend perpendicularly from two opposite lateral sides of the top face 121 of the heat spreader 12, respectively. In this embodiment, there are two posts 122 formed on each of two opposite lateral sides of the heat spreader 12. The posts 122 are substantially cylindrical (or column-shaped).

The heat sink 18 is arranged away from the heat spreader 12, and includes a plurality of fins stacked together.

The heat pipe 16 is generally L-shaped, and includes an evaporation section 162 and a condensing section 164 formed at opposite ends thereof. The evaporation section 162 of the heat pipe 16 is arranged on the top face 121 of the heat spreader 12. The condensing section 164 of the heat pipe 16 extends through the heat sink 18 and thermally contacts the fins. In this embodiment, the evaporation section 162 and the condensing section 164 of the heat pipe 16 are welded to the heat spreader 12 and the heat sink 18, respectively. Thus the components of the thermal module 10, including the heat spreader 12, the heat pipe 16 and the heat sink 18, are connected together.

The latching mechanism 30 includes two clips 14 connected to the heat spreader 12, and a latching frame 34 engaging with the clips 14.

The two clips 14 are substantially the same as each other. Each clip 14 includes a fixing plate 142 and two latching arms 144. The fixing plate 142 is an elongated flat sheet, and has a length approximately the same as that of the lateral side of the heat spreader 12 on which the posts 122 are formed. A plurality of fixing holes 1422 are defined in the fixing plate 142. In this embodiment, there are two fixing holes 1422 defined in the fixing plate 142, corresponding to the two posts 122 of a respective lateral side of the heat spreader 12. A diameter of each fixing hole 1422 is approximately the same as that of each corresponding post 122 of the heat spreader 12.

The two latching arms 144 of each clip 14 extend horizontally and aslant from opposite ends of the fixing plate 142, respectively. An angle defined between the two latching arms 144 is about 90 degrees. That is, the two latching arms 144 are approximately perpendicular to each other. An outer end 1442 of each of the latching arms 144 bends downwards and then outwards. Thus, the outer end 1442 of the latching arm 144 is lower than other portions of the latching arm 144. A latching hole 1444 is defined in the outer end 1442 of the latching arm 144. The clip 14 is made of elastically deformable material, such that each latching arm 144 is bendable.

The two clips 14 are fixed on the top face 121 of the heat spreader 12, and sandwich the evaporation section 162 of the heat pipe 16 therebetween. The fixing plate 142 of each clip 14 is disposed on one lateral side of the heat spreader 12, with the latching arms 144 located beyond the heat spreader 12. The posts 122 of the clips 14 respectively extend through the fixing holes 1422 of the fixing plate 142, and then are hammered to fix the clips 14 on the heat spreader 12. The four latching arms 144 of the two clips 14 are located on diagonals of the heat spreader 12, and the four latching holes 1444 are located at four corners of an imaginary square.

Referring to FIG. 1 again, a plurality of apertures 222 are defined in the circuit board 22 corresponding to the latching holes 1444 of the clips 14. The apertures 222 surround the electronic component 26.

Figure 3:
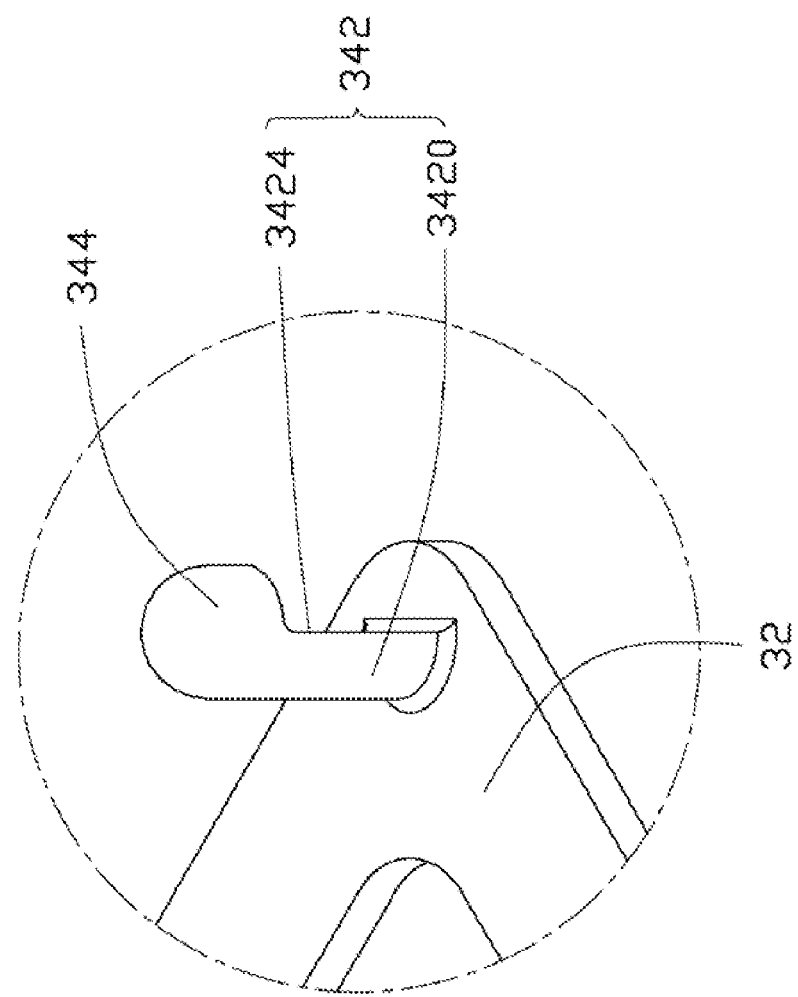
FIG. 3 is an enlarged view of a circle portion III of FIG. 1.

Referring to FIG. 3, the latching frame 32 is substantially square and hollow. A pole 34 extends perpendicularly up from each corner of the latching frame 32, with the four poles 34 engaging in the latching holes 1444 of the latching arms 144 of the clips 14. An outer size of the latching frame 32 is slightly larger than that of the imaginary square on which the latching holes 1444 of the latching arms 144 of the clips 14 are located. Preferably, the latching frame 32 is made of elastic material, such as plastic. In such case, when a force is applied to each pole 34, the pole 34 can resiliently deviate from its original position to be aslant to the latching frame 32.

Each pole 34 includes a main body 342, and a head 344 formed at a top end of the main body 342. In this embodiment, the main body 342 is semicolumnar, and has a semicircular cross section. The main body 342 includes a curved outer face 3420 and a planar outer face 3424. The curved outer faces 3420 of the main bodies 342 of the poles 34 face toward a center of the latching frame 32, while the planar outer faces 3424 of the main bodies 342 of the poles 34 face toward the outer corners of the latching frame 32.

The head 344 of each pole 34 is substantially cylindrical with a hemispherical top. A central axis of the head 344 is collinear with a central longitudinal axis of the planar outer face 3424 of the main body 342 of the pole 34. A vertical diameter of an imaginary sphere defined by the hemispherical top of the head 344 is collinear with the central axis of the head 344. Thus a half of the head 344 is located on the main body 342 of the pole 34, while the other half of the head 344 is beyond the main body 342 of the pole 34. Preferably, the central axis of the head 344 is offset from a central axis of the corresponding latching hole 1444 of the clip 14, and the diameter of the head 344 is equal to or less than that of the aperture 222 and equal to or less than that of the latching hole 1444. In this embodiment, the central axis of the head 344 is aligned with the corresponding latching hole 1444, and is offset from the central axis of the latching hole 1444 in a direction away from the center of the latching frame 32.

When the thermal module 10 is disposed on the electronic component 26, the bottom face 120 of the heat spreader 12 intimately contacts the electronic component 26, and the latching holes 1444 of the latching arms 144 of the clips 14 are aligned with the apertures 222 of the circuit board 22, respectively. When the clips 14 are in a relaxed (undeformed) state, a distance between a top side of the outer end 1442 of each latching arm 144 and a bottom side of the circuit board 22 is slightly greater than a length of the main body 342 of the corresponding pole 34 of the latching frame 32. The latching frame 32 is arranged under the circuit board 22, with the poles 34 respectively aligned with the apertures 222.

An external force is applied to each pole 34 of the latching frame 32 to make the poles 34 slant inwards towards the center of the latching frame 32 until the entire head 344 of each pole 34 is aligned with the corresponding aperture 222. Thus, the heads 344 of the poles 34 can extend through the apertures 222 of the circuit board 22 and the latching holes 1444 of the latching arms 144 of the clips 14 in turn. Finally the external forces on the poles 34 are canceled, and thus the poles 34 return to their original portions. Since the central axis of the head 344 of each pole 34 is offset from the central axis of the corresponding latching hole 1444, part of the head 344 beyond the pole 34 abuts against the top side of the outer end 1442 of the corresponding latching arm 144 around the latching hole 1444 after the head 344 has extended through the latching hole 1444 and the external force has been released. The thermal module 10 is thus fixed to the electronic device 100 by the engagement of the poles 34 of the latching frame 32 and the clips 14.

When the thermal module 10 needs to be disassembled, the poles 34 need only to be pushed inwards to disengage from the latching holes 1444 of the latching arms 144. Unlike with conventional assemblies, operating threaded elements during assembling and disassembling is not needed. Thus, assembling and disassembling of the thermal module 10 is convenient and quick.

During operation of the thermal module 10, heat generated by the electronic component 26 is first conducted to the heat spreader 12, then is transferred to the heat sink 18 by the heat pipe 16, and finally is dissipated to the ambient environment by the fins of the heat sink 18. When each clip 14 is in the relaxed state, the distance between the top side of the outer end 1442 of each latching arm 144 and the bottom side of the circuit board 22 is greater than the length of the main body 342 of the corresponding pole 34. Thus the latching arm 144 deforms slightly when the pole 34 is fixed in position. That is, when the thermal module 10 is fixed on the electronic component 26, the deformed latching arms 144 help ensure that the heat spreader 12 contacts the electronic component 26 closely to enhance heat conduction therebetween. Accordingly, the heat dissipation efficiency of the thermal module 10 is improved.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device, comprising:
   a circuit board defining a plurality of apertures therein;
   an electronic component arranged on the circuit board and surrounded by the apertures;
   a heat spreader contacting the electronic component;
   a plurality of latching arms provided on the heat spreader, the latching arms protruding outwards from the heat spreader, each latching arm defining a latching hole aligned with one of the apertures; and
   a frame comprising a plurality of elastic poles extending through the apertures and the latching holes in turn, respectively, each pole comprising a main body engaged in the corresponding latching hole and a head resiliently abutting against the corresponding latching arm;
   wherein the main body of each elastic pole comprises a curved outer face and a planar outer face joining the curved outer face, the curved outer face facing towards a center of the frame, and the planar outer face facing towards an outer corner of the frame.

2. The electronic device of claim 1, wherein a central axis of the head of each pole is offset from a central axis of the latching hole of the corresponding latching arm.

3. The electronic device of claim 2, wherein the main body of the pole is substantially semicolumnar, and the head of the pole is substantially cylindrical with a hemispherical top, half of the head being over the main body, and the other half of the head being beyond the main body and abutting against the corresponding latching arm.

4. The electronic device of claim 2, wherein the central axis of the head of the pole is aligned with the corresponding latching hole.

5. The electronic device of claim 4, wherein the central axis of the head of the pole is offset from the central axis of the corresponding latching hole in a direction away from the electronic component.

6. The electronic device of claim 1, wherein the frame is hollow and arranged at a side of the circuit board without the electronic component, the poles respectively extending from corners of the frame.

7. The electronic device of claim 1, wherein two of the latching arms extend from opposite ends of an elongated fixing plate, and the fixing plate is connected to the heat spreader.

8. The electronic device of claim 1, wherein two of the latching arms extend from opposite ends of an elongated fixing plate, another two of the latching arms extend from opposite ends of another elongated fixing plate, and the fixing plates are connected to opposite lateral sides of the heat spreader.

9. The electronic device of claim 1, further comprising a heat pipe and a heat sink, one end of the heat pipe being arranged between the fixing plates and contacting the heat spreader, the other end of the heat pipe thermally contacting the heat sink.

10. A latching mechanism for fixing a thermal module to an electronic component, the latching mechanism comprising:
   a clip comprising a fixing plate adapted for engaging with the thermal module and a plurality of latching arms extending outwards from the fixing plate, each latching arm defining a latching hole therein; and
   a frame comprising a plurality of elastic poles for respectively engaging with the plurality of latching arms, each pole comprising a main body configured to be engaged in the corresponding latching hole and a head configured to abut against the corresponding latching arm with a central axis of the head offset from a central axis of the latching hole;
   wherein the main body of each elastic pole comprises a curved outer face and a planar outer face joining the curved outer face, the curved outer face facing towards a center of the frame, and the planar outer face facing towards an outer corner of the frame.

11. The latching mechanism of claim 10, wherein the main body of the pole is semicolumnar, and the head of the pole is substantially cylindrical with a hemispherical top, half of the head being over the main body, and the other half of the head being beyond the main body and abutting against the corresponding latching arm.

12. The latching mechanism of claim 10, wherein the central axis of the head is aligned with the corresponding latching hole.

13. The latching mechanism of claim 12, wherein the central axis of the head is offset from the central axis of the corresponding latching hole in a direction away from the electronic component.

14. The latching mechanism of claim 10, wherein the frame is hollow and adapted for engaging with a circuit board on which the electronic component is arranged, the poles extending from corners of the frame, respectively.

15. An electronic device, comprising:
   a circuit board having a plurality of apertures defined therein, and comprising a first major side and an opposite second major side;
   an electronic component mounted on the first major side of the circuit board, the apertures surrounding the electronic component;
   a heat spreader intimately contacting the electronic component;
   a plurality of latching arms on the heat spreader, the latching arms protruding beyond edges of the heat spreader, each latching arm defining a latching hole aligned with one of the apertures; and
   a frame arranged at the second major side of the circuit board, the frame comprising a plurality of elastic poles extending from corners thereof, the poles extending through the apertures and the latching holes in turn, respectively, each pole comprising a main body engaged in the corresponding latching hole and a head elastically urging the corresponding latching arm;
   wherein the main body of each elastic pole comprises a curved outer face and a planar outer face joining the curved outer face, the curved outer face facing towards a center of the frame, and the planar outer face facing towards an outer corner of the frame.

* * * * *